Figure 1:
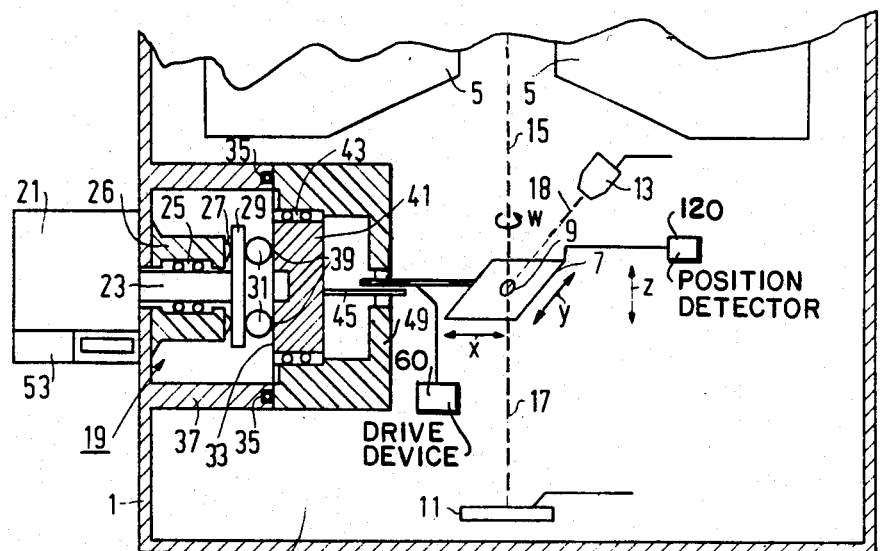

United States Patent [19]

Wondergem

[11] Patent Number: 4,661,968
[45] Date of Patent: Apr. 28, 1987

[54] BEAM EXPOSURE APPARATUS COMPRISING A DIAPHRAGM DRIVE FOR AN OBJECT CARRIER

[75] Inventor: Willem Wondergem, Eindhoven, Netherlands

[73] Assignee: U.S. Philips Corporation, New York, N.Y.

[21] Appl. No.: 792,631

[22] Filed: Oct. 31, 1985

Related U.S. Application Data

[63] Continuation of Ser. No. 508,203, Jun. 27, 1983.

[30] Foreign Application Priority Data

Mar. 23, 1983 [NL]  Netherlands .......................... 8301033

[51] Int. Cl.⁴ .......................... G01K 1/08; G01N 23/20
[52] U.S. Cl. ...................................... 378/79; 250/398; 250/442.1
[58] Field of Search ...................... 378/79–81, 378/208, 209; 250/491.1, 442.1; 108/137, 143; 74/89, 206, 798

[56] References Cited

U.S. PATENT DOCUMENTS

| | | | |
|---|---|---|---|
| 3,155,383 | 11/1964 | Whitmore | 108/143 |
| 3,790,155 | 2/1974 | Longamore | 250/442.1 |
| 3,855,469 | 12/1974 | Pluchery et al. | 378/79 |
| 3,962,663 | 6/1976 | Visser | 336/129 |
| 4,063,103 | 12/1977 | Sumi | 250/398 |
| 4,119,854 | 10/1978 | Tanaka et al. | 250/398 |
| 4,233,740 | 11/1980 | Bunn et al. | 74/89 |
| 4,271,713 | 6/1981 | Dona | 74/198 |
| 4,378,709 | 4/1983 | Chitayat | 108/143 |
| 4,409,860 | 10/1983 | Moriyama et al. | 108/143 |
| 4,465,934 | 8/1984 | Westerberg et al. | 250/398 |

FOREIGN PATENT DOCUMENTS 3020703  12/1981  Fed. Rep. of Germany ... 250/442.1

Primary Examiner—Janice A. Howell
Attorney, Agent, or Firm—Paul R. Miller

[57] ABSTRACT

A beam exposure apparatus is set forth comprising a mechanism for displacing an object being irradiated. This mechanism involves a drive mechanism. The drive mechanism may be rigidly connected to a wall of the apparatus, and a secondary shaft of the drive mechanism is connected by a friction coupling to a part of the object carrier which is to be positioned. The drive mechanism is driven by a direct current drive motor which is powered by a pulsed direct current. The object can be thus positioned with a step accuracy of approximately 0.2 micron. Such positioning can be measured with this accuracy be means of an inductive position detector.

12 Claims, 4 Drawing Figures

BEAM EXPOSURE APPARATUS COMPRISING A DIAPHRAGM DRIVE FOR AN OBJECT CARRIER

This is a continuation of application Ser. No. 508,203, filed June 27, 1983.

The invention relates to a beam exposure apparatus comprising a mechanism for positioning an object in a conditioned space in the apparatus.

Such an apparatus in the form of an electron beam exposure apparatus is known from U.S. Pat. No. 4,063,103. The apparatus described therein comprises a carrier table for an object to be exposed to an electron beam. The object carrier forms part of a positioning mechanism whereby the object can be displaced in two mutually perpendicular directions in a plane transversely of the electron beam. For the displacement of the object use is made of two drive motors which are connected to the object carrier, for example, by way of a bellows coupling. In, for example, electron beam exposure apparatus, electron microscopes such as scanning and transmission electron microscopes, X-ray analysis apparatus and the like it is often desirable to displace an object in steps of at the most, for example, 0.2 μm over a total distance of up to, for example, at least 10 mm; alternatively, rotation of an object in small, well-defined steps through a large range is desired. The operation of the known positioning mechanisms is usually inadequate for this purpose, or insufficiently reproducible or too time consuming. Moreover, they are often inadequate to achieve sufficiently small steps and the sealing of the conditioned space is often problematic.

The invention has for its object to mitigate these drawbacks; and to this end, an apparatus of the kind set forth in accordance with the invention is characterized in that the positioning mechanism comprises a diaphragm drive with a fixed diaphragm, a secondary shaft of the diaphragm drive being coupled to an object carrier.

Because the positioning mechanism in an apparatus in accordance with the invention may be rigidly coupled to a wall portion of the apparatus or to one of the parts of the carrier table and because the object drive is connected to a part of the carrier table to be displaced by way of a friction coupling, vibration-free, suitably reproducible positioning is achieved. Because a high transmission ratio of the diaphragm can be simply achieved, very accurate displacement is possible and the high flexibility in the control of the mechanism also enables quick displacement over a long distance or through a large angle. It is to be noted that the principle of a diaphragm drive is known from U.S. Pat. No. 4,271,713 in which the operation thereof is sufficiently disclosed.

The diagram in a preferred embodiment in accordance with the invention forms part of a partition of an object space to be conditioned. Consequently, the other possible problems concerning permanently tight sealing of the partition are avoided. The invention can be realized so that a rigid coupling is obtained at least in the desired directions.

A primary shaft of the drive mechanism for the diaphragm in a further preferred embodiment is driven by a direct current electric motor which is powered, for example, by a pulsed current. A simple pulse counter can then be used to control and measure the speed and orientation of the motor shaft as the primary shaft of the drive mechanism for the diaphragm. The speed of displacement can be determined throughout a large range on the basis of the repetition frequency of the power supply current.

The secondary shaft of the drive mechanism in a further preferred embodiment is connected, for example, to a carriage of an object carrier by way of a friction wheel. A drive rod of the object carrier can thus be clamped, between two rollers, together with the secondary shaft, so that no transverse forces act on the movement mechanism and play-free displacement of the object carrier is ensured.

For rotation of an object, a relevant part of the object carrier may be coupled directly to the secondary shaft of the displacement mechanism. For composite displacements, a motor unit for one of the displacements may be mounted on a carriage of the object carrier.

In a preferred embodiment in accordance with the invention in the form of an X-ray analysis apparatus, a first drive mechanism for the diaphragm provides rotation of the object and a second drive mechanism for the diaphragm which is electronically coupled to the first drive mechanism provides rotation of a detector which rotates, for example, with an angular velocity equal to twice the angular velocity of the object. Accurate angular adjustment of an object and correct positioning of a detector are thus simply achieved in such an apparatus.

Figure 2:
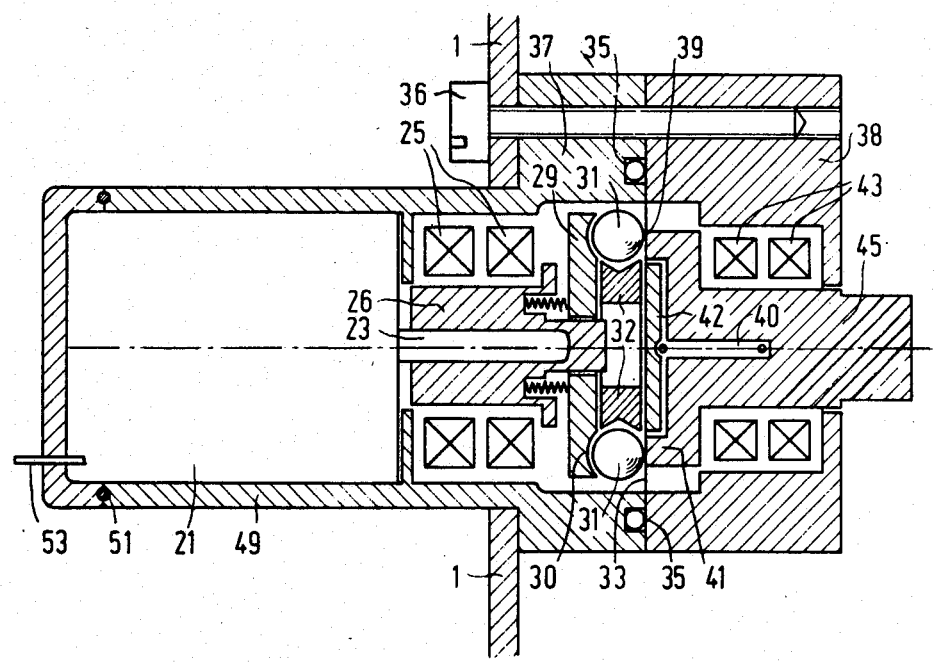
Figure 3:
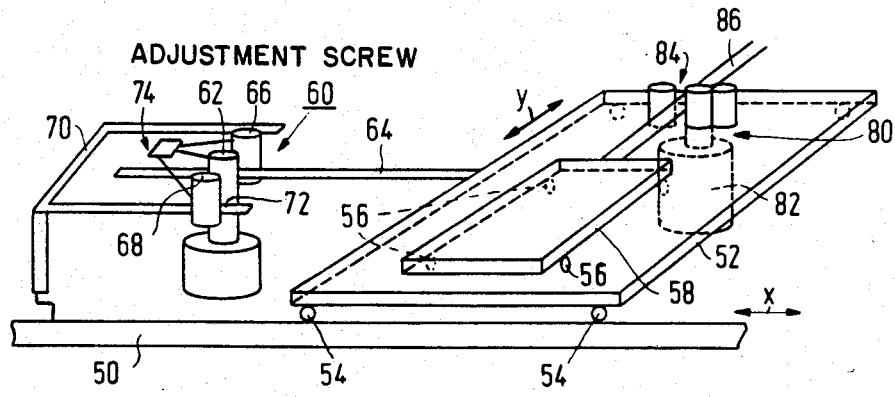
Figure 4:
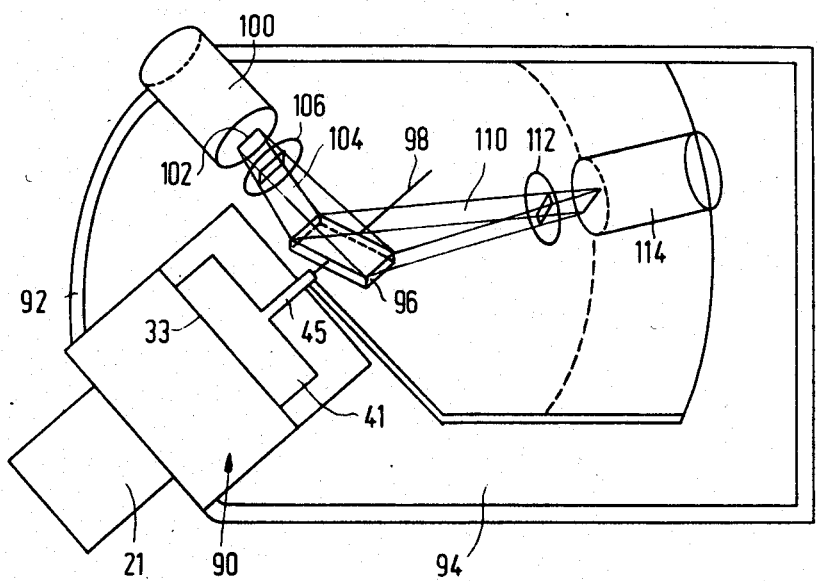

Some preferred embodiments in accordance with the invention will be described in detail hereinafter with reference to the drawing. Therein:

FIG. 1 shows the principle of a relevant part of an apparatus comprising a positioning mechanism in accordance with the invention, FIG. 2 is a more detailed representation of a diaphragm drive for this mechanism;

FIG. 3 diagrammatically shows an X-Y positioning mechanism for an electron microscope, and FIG. 4 shows a relevant part of an X-ray analysis apparatus comprising a rotation mechanism in accordance with the invention.

FIG. 1 shows a portion of a housing wall 1 of an electron microscope which encloses a vacuum space 3 accommodating an objective lens 5, an object carrier 7 with an object 9, a first detector 11 and a second detector 13. A part 17 of an electron beam 15 irradiating the object 9 is transmitted by the object and detected by detector 11, while the electrons, X-rays etc. 18 produced by the electron beam 15 on the object can be detected by the detector 13. The object carrier 7, being only diagrammatically shown, provides, for example translatory movements of the object in mutually perpendicular x, y and z directions, a rotation w about a z axis which in this case coincides with a principal ray of the beam 15, and tilting motions about the x axis as well as the y axis.

To this end, the apparatus in accordance with the invention comprises a drive mechanism 19 as shown in detail in FIG. 2. The drive mechanism comprises a primary shaft 23 which is journalled, for example, in a duplex bearing 25 which comprises two tandem-arranged bearings in order to take up the comparatively high load occurring at this area. To this end, a flexible coupling block 26 may be mounted on the primary shaft with a clamp fit with the block comprising a spring construction 27. The spring construction 27 is used to roll, for example, three balls 31 on a diaphragm 33 by way of a bearing disc 29 which is centered around the primary shaft 23. The balls 31 are accommodated, for example, in a vee-groove 30 in the bearing disc 29 and are maintained in position by a ball cage 32. The diaphragm 33 is connected to a bush 37 by way of a vacuum-tight connection 35, for example, an O-ring or (notably to improve the vacuum-tightness) by way of a seal containing, for example, indium. A mounting block 38 is clamped against the opposite side of the diaphragm 33 by means of a clamping device 36. The bush 37 thus forms a housing for the primary part of the drive mechanism and is, for example, rigidly connected to the housing wall 1. Opposite a track 39 on the diaphragm which is to be followed by the balls 31 there is situated a carrier 41 which forms a secondary shaft 45 on a side which is remote from the diaphragm with the secondary shaft 45 preferably also being journalled in a duplex bearing 43. Opposite a central portion of the diaphragm 33 which is situated within the track 39 there is mounted a plate 42 which is journalled by way of, for example, a pin or ball 40 which is centrally situated in the secondary shaft 45. The plate 42 relieves the diaphragm 33 of a frictional force which is otherwise produced by the vacuum pressure. Connected to the secondary shaft 45 is a drive rod or strip 64 for one of the parts of the object carrier 7, preferably via a construction which will be described with reference to FIG. 3 and which comprises friction wheels. Rotation of the primary shaft 23 results in rotation of the secondary shaft 45 with a transmission ratio which depends on the pressure of the balls 31 on the diaphragm 33, the diameter of the track 39, the diameter of the balls 31, the thickness of the diaphragm 33, and the elastic properties of the diaphragm 33 and the carrier 41. The transmission ratio can be chosen within wide limits, for example, between 1 to 500 and 1 to 50,000 by selection of these parameters. For a drive motor use can be made of a direct current motor or a step motor 21. The drive motor is accommodated in a housing section 49 (FIG. 2) which can be sealed, for example, by means of an O-ring seal 51 and which comprises a power supply lead 53. When a direct current motor is used, the speed of rotation of the primary shaft 23 can be controlled by way of the frequency of a pulse-shaped power supply current. For indication thereof use can be made of a counter indicator. The measurement of the translation or the rotation of the object 9 can be performed by means of known methods. For the measurement or the counting of the small displacement steps of the object carrier 7 in an apparatus in accordance with the invention, use can be made of, for example, the inductive position detector 120 (FIG. 1), such as disclosed in U.S. Pat. No. 3,962,663.

The preferred embodiment of an x, y translation mechanism comprising a drive mechanism as shown in FIG. 3 comprises a base plate 50 on which a first supporting carriage 52 is displaceable in an x direction on known means which are in this case rollers 54. On the supporting carriage 52 there is arranged a supporting carriage 58 which is displaceable in a y direction on rollers 56. A drive device 60 which is connected to the base plate 50 drives, via a friction coupling 62, a drive rod or foil 64 and hence the first supporting carriage 52. The friction coupling 62 in this case comprises two rollers 66 and 68 which are coupled in a clamping manner to the drive rod 64 and a secondary shaft 72 of the drive device 60 by way of a bracket 70 which is connected to the base plate 50.

The clamping force of the coupling can be adjusted by means of an adjustment screw 74.

A diaphragm drive 80 which is connected to the first supporting carriage 52 similarly produces a displacement of the carriage 58 in a y direction. For the sake of clarity, a drive motor 82 is mounted on a lower side of the first supporting carriage 52 and is connected to a second drive rod 86 by way of a fully analogous friction coupling 84. At the area of a path to be followed by the second diaphragm drive during the displacement of the first supporting carriage, the base plate 50 comprises an opening. A tilting motion can be imparted to the object in a corresponding manner by a slight modification of the friction coupling and the drive rod.

FIG. 4 shows an X-ray analysis apparatus comprising a drive mechanism 90 which is in principle identical to the drive mechanism 19. The diaphragm 33 of this drive mechanism 90 forms part of a sealing wall 92 for a space 94 in which a sample 96 to be examined can be arranged. The sample 96 can be tilted about shaft 98 which is coupled to the secondary shaft 45 of the diaphragm drive. The apparatus shown also comprises an X-ray tube 100 in which an X-beam 104 can be generated in a linear target 102 in order to irradiate the sample via a radiation entrance slit 106.

The beam 110 defracted by the sample 96 is intercepted by a detector 114 via a detector slit 112. The sample can be analyzed in an angle-dependent and hence wavelength-dependent known manner by tilting of the sample. As is known, the detector with the detector slit should then rotate at twice the angular velocity with respect to the sample, for example, as in a Bragg-Brentano set-up. To this end, use can be made of a second diaphragm drive (not shown) which is electronically controlled together with the drive of the first drive mechanism. Use can also be made of a single drive mechanism and a 2-to-1 coupling between the sample rotation and the detector rotation about the shaft 98. It is also possible to measure the orientation of the sample as well as of the detector, for example, by means of the inductive position detector 120.

What is claimed is:

1. In a beam exposure device comprising means for generating an electromagnetic beam, an object receiving said beam in an enclosed space, detecting means for detecting radiation from said object, and means for positioning said object, the improvement comprising said means for positioning comprising
an object carrier for carrying said object,
a first shaft coupled to said object carrier for moving said object carrier and said object in said beam,
a diaphragm for moving said first shaft,
a second shaft for moving said diaphragm, and
motor means for moving said second shaft.

2. A beam exposure device according to claim 1, wherein a supporting plate is connected by a pin to an end of said first shaft opposite to said object carrier, said supporting plate being adjacent said diaphragm, said diaphragm contacting both said supporting plate and edges of said end of said first shaft.

3. A beam exposure device according to claim 2, wherein said second shaft is coupled to said diaphragm by a bearing disc and a plurality of balls supported on said diaphragm, said second shaft and said bearing disc and plurality of balls being at an opposite side of said diaphragm from said first shaft and said supporting plate.

4. A beam exposure device according to claim 1 or claim 2 or claim 3, wherein said enclosed space is provided by a walled structure, said diaphragm forming a part of said walled structure.

5. A beam exposure device according to claim 4, wherein said enclosed space is evacuated.

6. A beam exposure device according to claim 4, wherein a seal containing a metal connects said diaphragm to said walled structure.

7. A beam exposure device according to claim 1 or claim 2 or claim 3, wherein said motor means includes a direct current motor having a pulsed direct current supply source.

8. A beam exposure device according to claim 7, wherein an inductive position detector is provided for measuring displacement of said object on said object carrier.

9. A beam exposure device according to claim 1 or claim 2 or claim 3, wherein said first shaft is connected to said object carrier by a friction coupling.

10. A beam exposure device according to claim 9, wherein said friction coupling includes at least two friction wheels, rod means for driving said object carrier coupled between said friction wheels, and said first shaft being coupled between said friction wheels.

11. A beam exposure device according to claim 1 or claim 2 or claim 3, wherein said electromagnetic beam is an electron beam, and said object is displaced in said electron beam.

12. A beam exposure device according to claim 1 or claim 2 or claim 3, wherein said electromagnetic beam is an X-ray beam, and said object is rotatably displaced in said X-ray beam.

* * * * *